United States Patent
Muramatsu

(10) Patent No.: US 6,315,826 B1
(45) Date of Patent: Nov. 13, 2001

(54) SEMICONDUCTOR SUBSTRATE AND METHOD OF MANUFACTURING THE SAME

(75) Inventor: Satoru Muramatsu, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/599,193

(22) Filed: Jun. 22, 2000

Related U.S. Application Data

(62) Division of application No. 09/021,467, filed on Feb. 10, 1998, now abandoned.

(30) Foreign Application Priority Data

Feb. 12, 1997 (JP) ..................................................... 9-027607

(51) Int. Cl.[7] ............................................................. C30B 25/18
(52) U.S. Cl. ...................... 117/95; 117/2; 117/3; 117/96; 117/97; 117/935
(58) Field of Search ............................. 117/2, 3, 95, 96, 117/97, 935

(56) References Cited

U.S. PATENT DOCUMENTS

| | | | |
|---|---|---|---|
| 4,608,095 | * | 8/1986 | Hill ........................................ 148/33 |
| 4,962,051 | * | 10/1990 | Liaw ..................... 437/26 |
| 5,419,786 | * | 5/1995 | Kokawa et al. .................... 148/33.5 |
| 5,504,022 | * | 4/1996 | Nakanishi et al. ...................... 437/33 |
| 5,698,891 | * | 12/1997 | Tomita et al. ........................ 257/610 |
| 5,806,477 | * | 2/1999 | Ogawa et al. ........................ 438/626 |

OTHER PUBLICATIONS

Unexamined Patent Application Publication (Kokai) No. 04–262537.
Unexamined Patent Application Publication (Kokai) No. 07–086289.
Unexamined Patent Application Publication (Kokai) No. 63–198334.
Boxed material and English translation thereof.

* cited by examiner

Primary Examiner—Robert Kunemund
(74) Attorney, Agent, or Firm—Michael Best & Friedrich LLC; J. Warren Whitesel

(57) ABSTRACT

Disclosed are a structure of a semiconductor substrate and a method of manufacturing the semiconductor substrate preventing a reduction of gettering capability due to a high-temperature heat treatment. In a semiconductor substrate containing a highly concentrated impurity having a polysilicon layer to be a gettering site on a rear surface side and an epitaxial layer 6 on a front surface side, an impurity concentration is lower near the rear and front surfaces and higher at the center in a cross section of the semiconductor substrate. The method of manufacturing the semiconductor substrate comprises the steps of: performing the heat treatment of a silicon substrate at a temperature of 1100° C. or more and a melting temperature or less of the silicon substrate before forming the polysilicon layer 4 and the epitaxial layer 6; forming the polysilicon layer 4 on the rear surface side of the silicon substrate; and forming the epitaxial layer 6 on the front surface side of the silicon substrate.

5 Claims, 5 Drawing Sheets

CHAMFERING

MECHANICAL POLISHING

POLYSILICON GROWTH

BLOCKING OXIDE FILM GROWTH

MIRROR POLISHING

EPITAXIAL GROWTH

REDUCTION OF IMPURITY CONCENTRATION ON FRONT SURFACE LAYER DUE TO OUTWARD DIFFUSION

↓ DEVICE HEAT TREATMENT

↓ DEVICE HEAT TREATMENT

GRAIN GROWTH SUPPRESSED

CONSIDERABLE GRAIN GROWTH RESULTING IN REDUCTION OF GETTERING CAPABILITY

FIG. 3D CHAMFERING
FIG. 3E MECHANICAL POLISHING
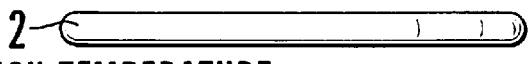
FIG. 3F HIGH-TEMPERATURE HEAT TREATMENT
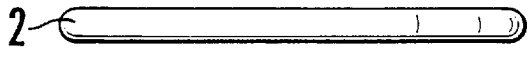
FIG. 3G POLYSILICON GROWTH
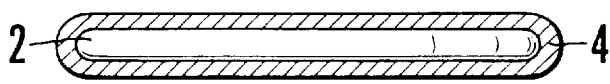
FIG. 3H BLOCKING OXIDE FILM GROWTH
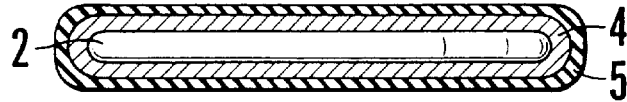
FIG. 3I MIRROR POLISHING
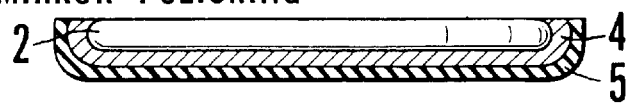
FIG. 3J EPITAXIAL GROWTH
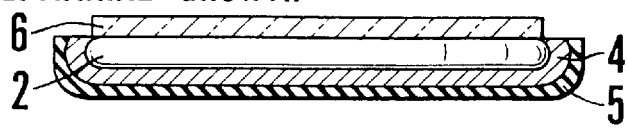

FIG. 4D CHAMFERING ↓
FIG. 4E MECHANICAL POLISHING ↓
FIG. 4F HIGH-TEMPERATURE (IN OXIDIZING HEAT TREATMENT ATMOSPHERE)
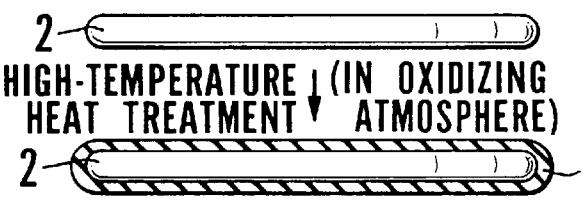
FIG. 4G REMOVAL OF OXIDE FILM ↓
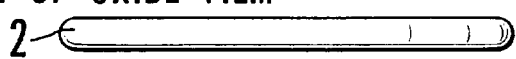
FIG. 4H POLYSILICON GROWTH ↓
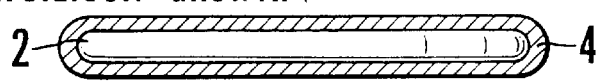
FIG. 4I BLOCKING OXIDE FILM GROWTH ↓
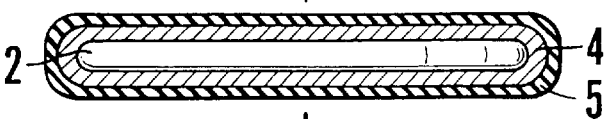
FIG. 4J MIRROR POLISHING ↓
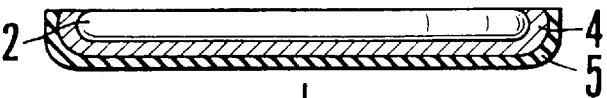
FIG. 4K EPITAXIAL GROWTH ↓
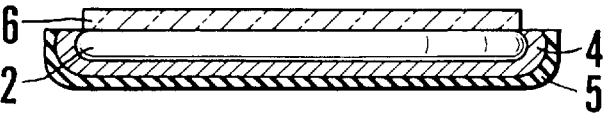

SEMICONDUCTOR SUBSTRATE AND METHOD OF MANUFACTURING THE SAME

This is a division of U.S. Ser. No. 09/021,467, filed Feb. 10, 1998 now abondened.

BACKGROUND OF THE INVENTION

1. Field of the Invention

The present invention relates to an improvement in yield in a manufacture of a semiconductor device and more specifically, relates to a structure of a semiconductor substrate and a method of manufacturing the semiconductor substrate for reducing an influence of a heavy metal element.

2. Description of the Prior Art

[Prior Art 1]

A semiconductor is classified into a P type and an N type depending on an impurity contained in the semiconductor. A semiconductor device functions in accordance with a combination of the P type and the N type. The impurity to be contained in the semiconductor is typically introduced by an ion implantation and a diffusion method. It is technically difficult for these methods to form a steep gradient of an impurity concentration and to form a layer of lower impurity concentration on the layer of higher impurity concentration. In order to solve this problem, used is a semiconductor substrate (hereinafter referred to as an "epitaxial substrate") on which an epitaxial growth is performed on a main front surface. By the use of this method, it is possible to easily form the steep gradient of the impurity concentration and form the layer of lower impurity concentration on the layer of higher impurity concentration. A high pressure resistance of a semiconductor element, an improvement in a latch-up resistance, the improvement in an a ray strength or the like can be thus expected. The epitaxial substrate is also used for the reason why the epitaxial substrate has less crystal imperfections on the substrate surface.

[Prior Art 2]

On the other hand, a high integration and a fine formation of the semiconductor device cause a process of manufacturing the semiconductor device to be complicated. Thus, the manufacturing process is often influenced by a metal contamination during the process. Since a metal causes a deterioration of device properties such as a precipitation in a silicon crystal, a reduction of the metal contamination is attempted. However, due to a technical problem and a cost problem, it is disadvantageously difficult to completely prevent this metal contamination.

A metal contaminant invading the semiconductor substrate is captured on a portion other than a device active region on the main front surface side of the semiconductor substrate, whereby a gettering technique can prevent the deterioration of device properties even if the metal contamination occurs. Since the gettering technique is performed at relatively low cost and also improves a yield, it is widely used for a manufacture of the semiconductor device. One method of this gettering technique is an extrinsic gettering method for forming a gettering site by a polysilicon for capturing a metallic element on a rear surface of the semiconductor substrate.

The importance of the above-described prior arts 1 and 2 has been recently rising in the manufacture of the semiconductor device. The prior arts have been frequently used. Thus, the semiconductor substrate is sometimes used by the combination of the prior arts 1 and 2. Referring to FIGS. 1A–1I, the method of manufacturing the semiconductor substrate by the combination of the prior arts 1 and 2 will be described below as the prior art. FIGS. 1A–1I show, in order of processes, the processes of manufacturing the semiconductor substrate of the prior art.

In the first place, as shown in FIG. 1A, a Si single-crystal ingot containing a highly concentrated impurity is cylindrically worked by means of an outer diameter grinding. This cylindrical ingot 1 is cut into blocks. The cut ingot 1 is then sliced, whereby a Si substrate 2 is cut out in wafer shape (FIG. 1B). FIGS. 1C–1I showing the subsequent processes show a cross section of the Si substrate 2. The cut-out Si substrate 2 (FIG. 1C) is chamfered in order to bevel peripheral corners (FIG. 1D). The Si substrate 2 is then mechanically polished in order to smooth the Si substrate 2 and to improve parallelism (FIG. 1E). Next, a damaged layer (not shown) formed on a front surface layer of the Si substrate 2 is removed by etching. A polysilicon layer 4 to be the gettering site is then formed up to about 500–2000 nm on the rear surface or both of the front and rear surfaces of the Si substrate 2 (FIG. 1F). A blocking oxide film 5 for preventing an auto-doping is subsequently formed on the polysilicon layer 4 (FIG. 1G). Next, a mechanical chemical polishing is performed so as to thereby remove the polysilicon layer 4 and the blocking oxide film 5 on the main front surface side of the Si substrate 2 and to mirror polish the main front surface of the removed Si substrate 2 (FIG. 1H). An epitaxial Si layer 6 is finally grown to about 0.1–25 µm on the front surface of this polished Si substrate 2 (FIG. 1I).

The above-mentioned manufacturing process can manufacture the semiconductor substrate having the epitaxial Si layer 6 on the main front surface of the semiconductor substrate 2 and the polysilicon layer 4 to be the gettering site on the rear surface thereof.

On the other hand, the process of manufacturing the epitaxial substrate typically includes the process of removing a natural oxide film on the Si substrate and of performing the epitaxial growth. In this process, it is necessary to heat the Si substrate to 1000–1200° C. Even during the process of manufacturing the semiconductor device, it is also necessary to perform a thermal oxidation process and a heat treatment of a drive-in or the like of a well. The heat treatment is frequently performed at about 700–1200° C.

Due to such a heat treatment, the impurity such as boron, phosphorus, antimony and arsenic, which the Si substrate 2 is highly doped with, is flied out from the Si substrate 2. That is, a so-called outward diffusion phenomenon occurs. As a result, many dopant impurities enter the polysilicon layer 4 to be the gettering site. A grain of the polysilicon layer 4 is greatly grown. In the polysilicon, a strain field in a grain boundary and the strain field due to a lattice mismatching are one of the gettering site. Thus, it is known that an increase of grain size causes a considerable reduction of gettering capability (see p.p. 194–199, "VLSI process control engineering", Hideki Tsuya, Maruzen Corp.).

As described above, in case of manufacturing the semiconductor substrate by the combination of the prior arts 1 and 2 or in case of manufacturing the semiconductor device using such a semiconductor substrate, the grain size in a gettering layer is increased due to the outward diffusion phenomenon of the dopant impurity by a high-temperature heat treatment. This causes a problem in which the gettering capability is reduced.

SUMMARY OF THE INVENTION

The present invention is made in view of the above problems. It is an object of the present invention to provide a structure of a semiconductor substrate and a method of manufacturing the semiconductor substrate in which a reduction of gettering capability due to a high-temperature heat treatment is prevented in the semiconductor substrate containing a highly concentrated impurity having a polysilicon layer to be a gettering site on a rear surface side and an epitaxial layer on a front surface side.

In order to achieve the above object, according to the present invention, there is provided a semiconductor substrate containing a highly concentrated impurity having a polysilicon layer to be a gettering site on a rear surface side and an epitaxial layer on a front surface side, wherein an impurity concentration is lower near the rear and front surfaces and higher at the center in a cross section of the semiconductor substrate.

The impurity concentration is lower near the rear surface side of the semiconductor substrate. This can suppress an amount of the impurity entering the polysilicon layer to be the gettering site due to an outward diffusion, even if the high-temperature heat treatment is performed. Thus, a grain growth is suppressed in the polysilicon layer. The reduction of gettering capability is also suppressed.

According to the present invention, there is a method of manufacturing a semiconductor substrate containing a highly concentrated impurity having a polysilicon layer to be a gettering site on a rear surface side and an epitaxial layer on a front surface side, the method which comprises the steps of: performing a heat treatment of a silicon substrate at a temperature of 1100° C. or more and a melting temperature or less of the silicon substrate before forming the polysilicon layer and the epitaxial layer; forming the polysilicon layer on the rear surface side of the silicon substrate; and forming the epitaxial layer on the front surface side of the silicon substrate.

The heat treatment is previously performed on the silicon substrate at 1100° C. or more, whereby the impurity near the front and rear surfaces of the substrate is outwardly diffused. The polysilicon layer and the epitaxial layer are then formed. Thus, the impurity concentration can be higher at the center and lower near the front and rear surfaces in the cross section of the silicon substrate.

BRIEF DESCRIPTION OF THE DRAWINGS

FIGS. 3A–3J are illustrations showing, in order of processes, the processes of manufacturing the semiconductor substrate according to a first embodiment of the present invention;

FIGS. 4A–4K are illustrations showing, in order of processes, the processes of manufacturing the semiconductor substrate according to a second embodiment of the present invention.

DETAILED DESCRIPTION OF THE PREFERRED EMBODIMENTS

The present invention will be described below with reference to the accompanying drawings.

Figure 1A:
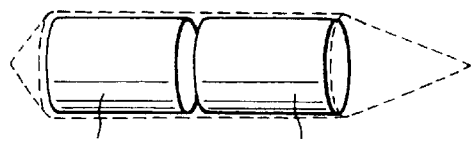
FIGS. 1A–1I are illustrations showing, in order of processes, processes of manufacturing a semiconductor substrate according to the prior art.
Figure 1B:
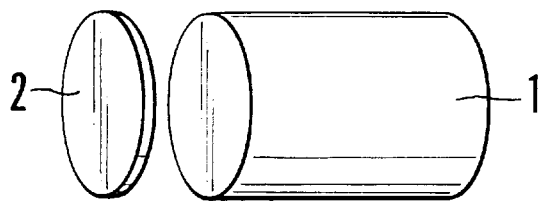
Figure 1C:
Figure 1D:
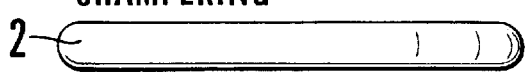
Figure 1E:
Figure 1F:
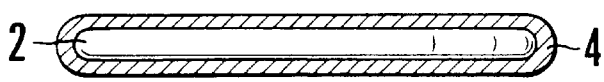
Figure 1G:
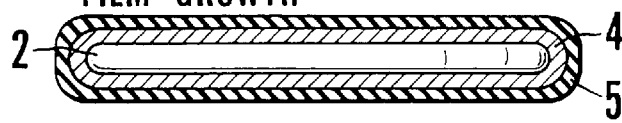
Figure 1H:
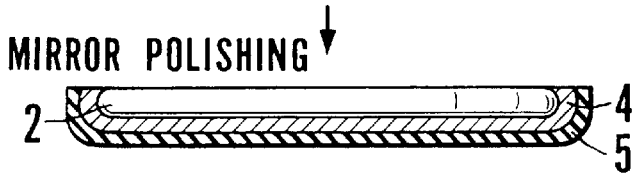
Figure 1I:
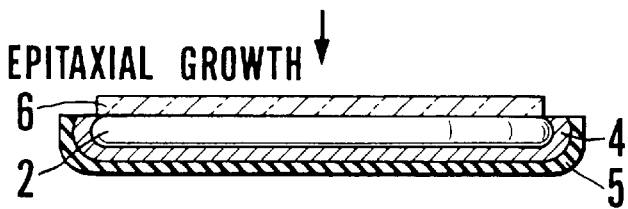
Figure 2A:
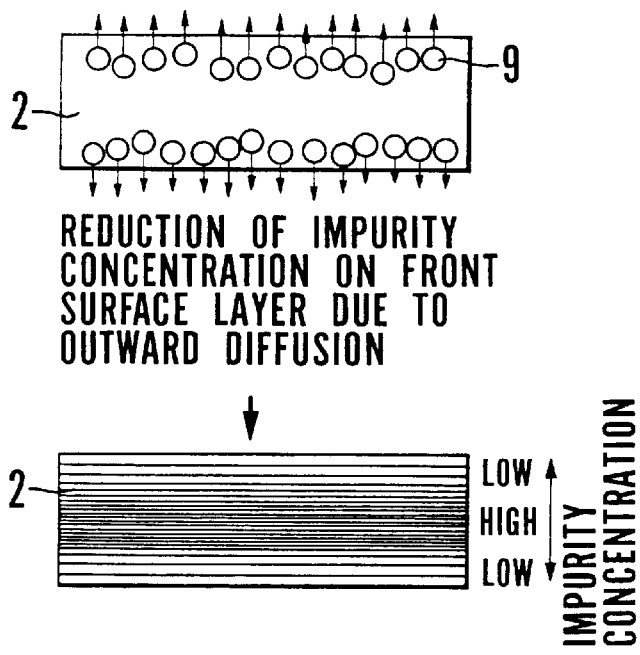
FIG. 2A is a schematic illustration showing an arrangement of a function of the semiconductor substrate according to the present invention.
Figure 2B:
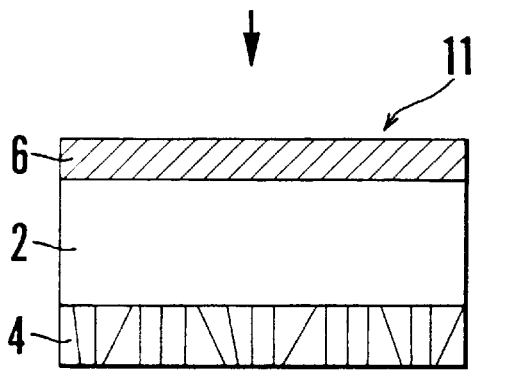
FIG. 2B is a schematic illustration showing the arrangement of the function of the semiconductor substrate of the prior art.
Figure 2B:
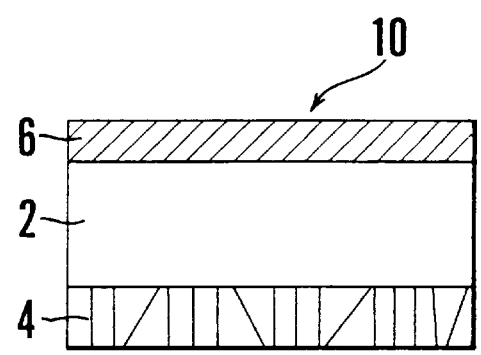
Figure 2B:
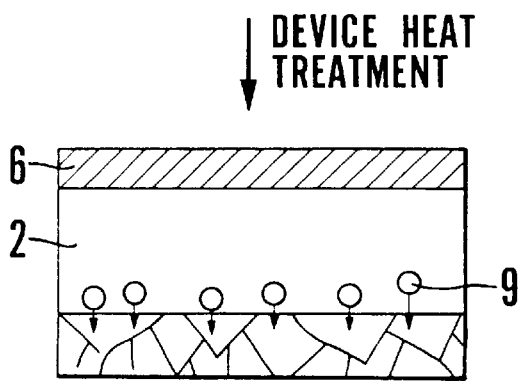
Figure 2B:
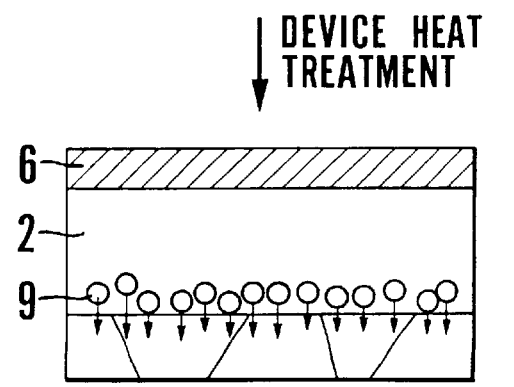

FIGS. 2A and 2B are schematic illustrations showing an arrangement and a function of a semiconductor substrate according to the present invention compared to the prior art. FIG. 2A shows the semiconductor substrate according to the present invention. FIG. 2B shows the semiconductor substrate of the prior art.

As shown in FIG. 2B, a prior-art semiconductor substrate 10 has an epitaxial layer 6 and a polysilicon layer 4 to be a gettering site on front and rear surface sides, respectively, of an Si substrate 2 having a highly concentrated impurity. A high-temperature heat treatment is performed on the semiconductor substrate 10. At this time, an impurity 9, with which the Si substrate 2 is highly doped enters the polysilicon layer 4 due to an outward diffusion. Thus, a grain size is increased, whereby gettering capability is reduced.

On the other hand, as shown in FIG. 2A, according to the present invention, the heat treatment is performed at 1100° C. or more and a melting temperature or less of the silicon substrate before forming the polysilicon layer 4 on the rear surface side of the Si substrate 2 having the highly concentrated impurity. The dopant impurity 9 near the front and rear surfaces of the Si substrate 2 is previously outwardly diffused. An impurity concentration is higher at the center and lower near the front and rear surfaces in a cross section of the Si substrate 2. The polysilicon layer 4 to be the gettering site is then formed on the rear surface side of the Si substrate 2. The epitaxial Si layer 6 is grown on the front surface side of the Si substrate 2. The high-temperature heat treatment is performed on a semiconductor substrate 11 manufactured in such a manner. At this time, the impurity concentration is lower near the rear surface side of the Si substrate 2. Thus, since the outwardly diffused impurity 9 is smaller in quantity than the prior art, a grain growth is suppressed. Therefore, a reduction of gettering capability is also suppressed. Since the impurity concentration is also lower on the front surface side of the Si substrate 2, an auto-doping with the impurity and an occurrence of a misfit dislocation are suppressed.

A first embodiment and a second embodiment of the present invention will be described below with reference to FIGS. 3A–3J and 4A–4K.

Embodiment 1

Figure 3A:
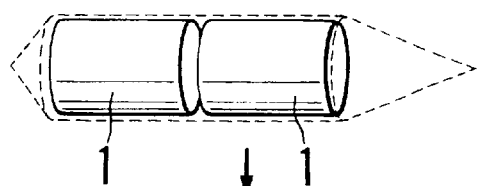
Figure 3B:
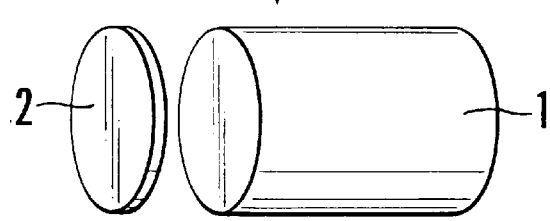
Figure 3C:
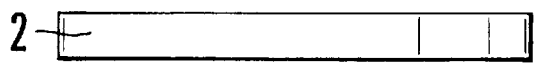

FIGS. 3A–3J are illustrations showing, in order of processes, processes of manufacturing the semiconductor substrate according to the first embodiment. As shown in FIG. 3A, an Si single-crystal ingot containing the highly concentrated impurity is cylindrically worked by means of an outer diameter grinding. This cylindrical ingot 1 is cut into blocks. The cut ingot 1 is then sliced, whereby the Si substrate 2 is cut out in wafer shape (FIG. 3B). FIGS. 3C–3J showing the subsequent processes show the cross section of the Si substrate 2. The cut-out Si substrate 2 (FIG. 3C) is chamfered in order to bevel peripheral corners (FIG. 3D). The Si substrate 2 is then mechanically polished in order to smooth the chamfered Si surface 2 and to improve parallelism (FIG. 3E). Next, a damage layer (not shown) formed on a front surface layer of the Si substrate 2 is removed by an etching process.

The heat treatment at 1100° C. or more, which is a feature of the present invention, is then performed (FIG. 3F). Preferably, this heat treatment is performed for 10 minutes or more at 1100° C. or more and the melting temperature or less of the silicon substrate in order to obtain an effect of the present invention. More preferably, an introduced gas is an inert gas such as Ar and He during this heat treatment. More preferably, the heat treatment is performed in an H2 atmosphere.

After the above-described heat treatment, the polysilicon layer 4 to be the gettering site is formed to about 500–2000 nm on the rear surface or both of the front and rear surfaces of the Si substrate 2 (FIG. 3G). A blocking oxide film 5 for preventing the auto-doping is subsequently formed on the polysilicon layer 4 (FIG. 3H). Next, a mechanical chemical polishing is performed on a main front surface of the Si substrate 2 so as to thereby remove she polysilicon layer 4 and the blocking oxide film 5 on the main front surface of the Si substrate 2 and to mirror polish the main front surface of the removed Si substrate 2 (FIG. 3I). The epitaxial Si layer 6 is finally grown to about 0.1–25 µm on the front surface of this polished Si substrate 2 (FIG. 3J).

The above-mentioned manufacturing process can manufacture an epitaxial substrate having the polysilicon layer 4 to be the gettering site on the rear surface of the Si substrate having the highly concentrated impurity.

Embodiment 2

Figure 4A:
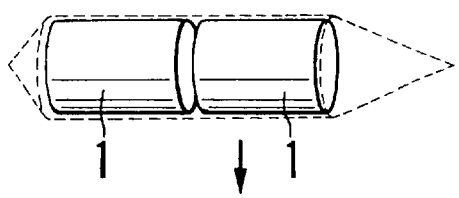
Figure 4B:
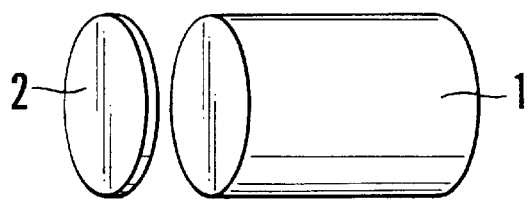
Figure 4C:

FIGS. 4A–4K are illustrations showing, in order of processes, the processes of manufacturing the semiconductor substrate according to the second embodiment As shown in FIG. 4A, the Si single-crystal ingot containing the highly concentrated impurity is cylindrically worked by means of the outer diameter grinding. This cylindrical ingot 1 is cut into blocks. The cut ingot 1 is then sliced, whereby the Si substrate 2 is cut out in wafer shape (FIG. 4B). FIGS. 4C–4K showing the subsequent processes show the cross section of the Si substrate 2. The cut-out Si substrate 2 (FIG. 4C) is chamfered in order to bevel the peripheral corners (FIG. 4D). The Si substrate 2 is then mechanically polished in order to smooth the chamfered Si surface 2 and to improve the parallelism (FIG. 4E). The damage layer (not shown) formed on the front surface layer of the Si substrate 2 is removed by the etching process.

The heat treatment at 1100° C. or more, which is the feature of the present invention, is then performed (FIG. 4F). Preferably, this heat treatment is performed for 10 minutes or more at 1100° C. or more and the melting temperature or less of the silicon substrate in order to obtain the effect of the present invention. More preferably, the heat treatment is performed in the atmosphere of a mixed gas of $N_2$ and $0_2$ as the introduced gas during this heat treatment. In this heat treatment, since the introduced gas is the gas containing an oxidizing atmosphere, an oxide film 3 is formed on the front surface of the Si surface 2. The outwardly diffused impurity can be absorbed in this oxide film 3. After this heat treatment, the oxide film 3 is removed (FIG. 4G).

After the above-described heat treatment and oxide film removing process, the polysilicon layer 4 to be the gettering site is formed to about 500–2000 nm on the rear surface or both of the front and rear surfaces of the Si substrate 2 (FIG. 4H). The blocking oxide film 5 for preventing the auto-doping is subsequently formed on the polysilicon layer 4 (FIG. 4I). Next, the mechanical chemical polishing is performed on the main front surface of the Si substrate 2 so as to thereby remove the polysilicon layer 4 and the blocking oxide film 5 on the main front surface of the Si substrate 2 and to mirror polish the main front surface of the removed Si substrate 2 (FIG. 4J). The epitaxial Si layer 6 is finally grown to about 0.1–25 µm on the front surface of this polished Si substrate 2 (FIG. 4K).

The above-mentioned manufacturing process can manufacture the epitaxial substrate having the polysilicon layer 4 to be the gettering site on the rear surface of the Si substrate having the highly concentrated impurity.

Figure 5:
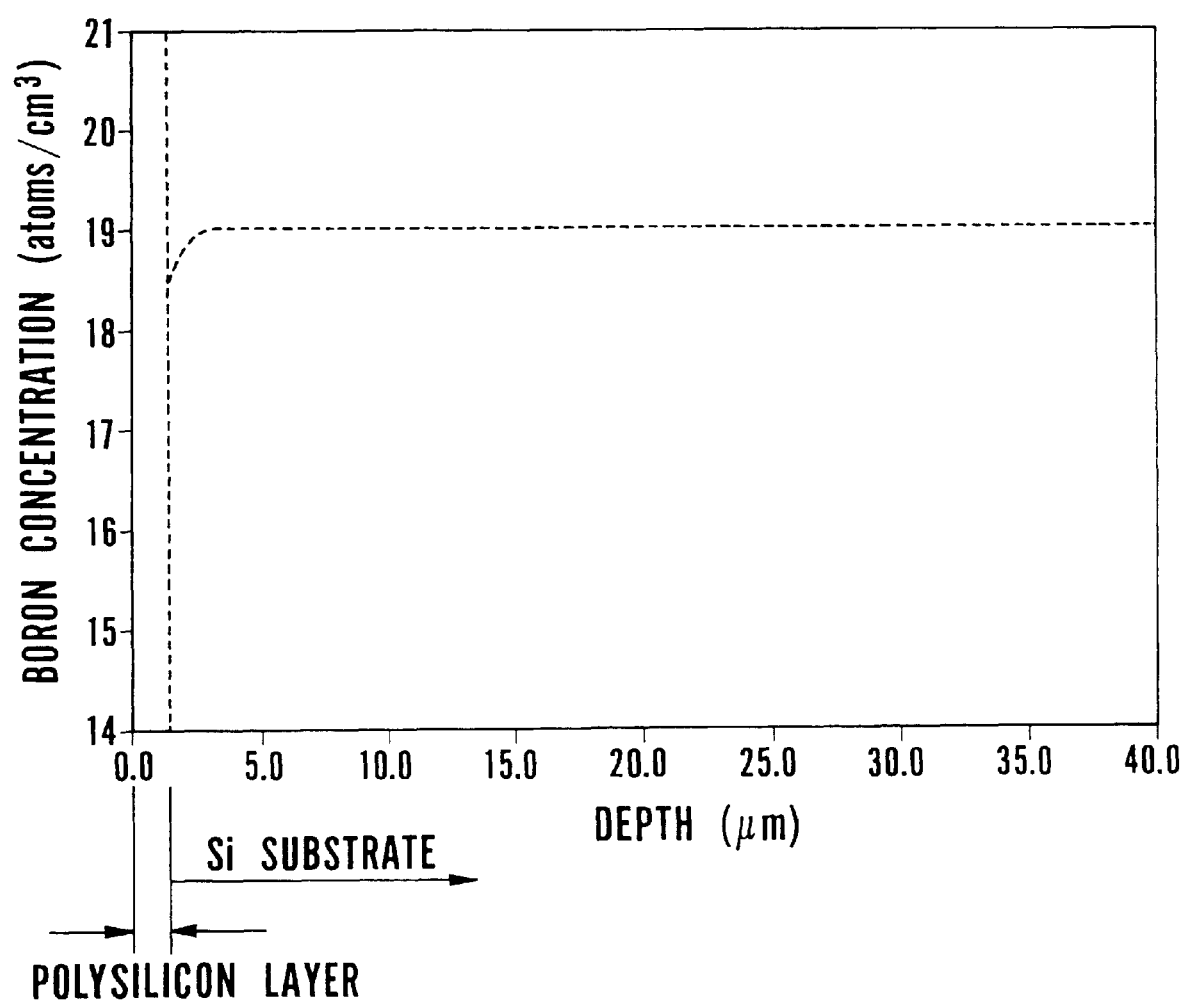
FIG. 5 is a graph showing a result of a calculation of an impurity concentration near a front surface of an Si substrate on which a heat treatment is performed by a method according to the first embodiment of the present invention.

Finally, FIG. 5 shows a result of a calculation of the impurity concentration near the front surface of the Si substrate on which the method according to the first embodiment of the present invention is used whereby the heat treatment is performed for 1 hour at 1150° C. on the Si substrate containing boron of $1 \times 10^{19}$ (atm/cm$^{-3}$) and the polysilicon layer is then formed to 1.2 mm at 670° C. In a graph shown in FIG. 5, an ordinate axis represents a boron concentration, and a transverse axis represents a depth from the front surface of the Si substrate. As can be seen from FIG. 5, the impurity concentration on the front surface of the Si substrate is reduced due to the heat treatment. Under these conditions, the impurity concentration can be reduced as much as about 1 order.

In the above-described embodiments, for example, a diffusion furnace is used for the heat treatment at 1100° C. or more and the melting temperature or less of the silicon substrate which is the feature of the present invention. In this case, a vertical diffusion furnace or a horizontal diffusion furnace can be used.

As described above, the semiconductor substrate and the method of manufacturing the same according to the present invention can provide the semiconductor substrate containing the highly concentrated impurity having the polysilicon layer to be the gettering site on the rear surface side and the epitaxial layer on the front surface side, wherein the impurity concentration is lower near the rear and front surfaces and higher at the center in the cross section of the semiconductor substrate. The reduction of gettering capability due to the high-temperature heat treatment can be prevented. Thus, in the process of manufacturing the semiconductor device, more specifically, an influence of a heavy metal contamination can be reduced. An improvement in yield can be also accomplished.

What is claimed is:

1. A method of manufacturing a silicon epitaxial substrate containing a highly concentrated impurity having a polysilicon layer to be a gettering site on a rear surface side and an epitaxial layer on a front surface side, the method comprising the steps of:

(a) removing a damage layer formed on a front surface of a silicon substrate cut out of a silicon ingot doped with a highly concentrated impurity;

(b) heat treating said silicon substrate at a temperature of at least 1100° C. but not over a melting temperature of said silicon substrate, said temperature causing said impurity existing near the front surface and the rear surface of said silicon substrate to diffuse outwardly, said impurity concentration in a cross section of said semiconductor substrate becoming lower near the rear and front surfaces and higher at a center of said substrate, said impurity forming a gettering site of a non-doped polysilicon layer on both of said surfaces of said silicon substrate;

(c) forming a blocking oxide film on said polysilicon layer for prevention of auto-doping conditions;

(d) removing said blocking oxide film and said polysilicon layer on a major front surface of said silicon substrate to mirror polish said major front surface; and (e) forming a silicon expitaxial layer on said mirror polished surface on said major front surface of said silicon substrate.

2. The manufacturing method according to claim 1, wherein said heat treatment of said silicon substrate is performed for at least 10 minutes.

3. The manufacturing method according to claim 1, wherein said heat treatment comprises the steps of:

forming an oxide film on the front surface of the mechanically-polished silicon substrate; and removing said oxide film.

4. The manufacturing method according to claim 3, wherein said oxide film forming step is performed in an atmosphere of a mixed gas of $N_2$, and $O_2$.

5. A method of manufacturing a silicon epitaxial substrate containing a highly concentrated impurity having a polysilicon layer to be a gettering site on a rear surface side and an epeitaxial layer on a front surface side, the method comprising the steps of:

(a) removing a damage layer formed on a front surface of a silicon substrate cut out of a silicon ingot doped with highly concentrated impurity;

(b) heat treating said silicon substrate under an oxidizing atmosphere at a temperature of at least 1100° C. but not over a melting temperature of said silicon substrate, said temperature forming an oxide film on both surfaces of said substrate and causing said impurity existing near the front surface and the rear surface of said silicon substrate to diffuse into said oxide film, the impurity concentration in a cross section of said semiconductor substrate becoming lower near the rear and front surface and higher at a center thereof;

(c) removing said oxide film;

(d) forming a gettering site of a non-doped polysilicon layer on both surfaces of said silicon substrate;

(e) forming a blocking oxide film on said polysilicon layer for preventing an auto-doping condition;

(f) removing said blocking oxide film and said polysilicon layer on a major front surface of said silicon substrate to mirror polish said major front surface; and (g) forming a silicon epitaxial layer on said mirror polished surface on said major front surface of said silicon substrate.

* * * * *